United States Patent [19]

Nebuloni et al.

[11] Patent Number: 5,363,062
[45] Date of Patent: Nov. 8, 1994

[54] AUDIO AMPLIFIER ON-OFF CONTROL CIRCUIT

[75] Inventors: Daniela Nebuloni, Bareggio; Andrea Fassina, Milan, both of Italy

[73] Assignee: SGS-Thomson Microelectronics s.r.l., Agrate Brianza, Italy

[21] Appl. No.: 65,633

[22] Filed: May 21, 1993

[30] Foreign Application Priority Data

May 22, 1992 [EP] European Pat. Off. ......... 92830254.6

[51] Int. Cl.[5] ........................... H03F 1/26; H03F 1/30; H03G 3/34
[52] U.S. Cl. ...................................... 330/296; 330/51; 381/120; 381/121; 381/122; 381/123
[58] Field of Search ................... 330/51, 296; 381/120, 381/121, 94, 122, 28, 123

[56] References Cited
U.S. PATENT DOCUMENTS 4,638,507   1/1987   Palara et al. ..................... 381/120

FOREIGN PATENT DOCUMENTS 0159079  10/1985  European Pat. Off. .
0368528   5/1990  European Pat. Off. .

Primary Examiner—William L. Sikes
Assistant Examiner—Fetsum Abraham
Attorney, Agent, or Firm—Seed and Berry

[57] ABSTRACT

A circuit for controlling on-off switching of an audio amplifier in such a manner as to prevent sharp uncontrolled variations of the output during switching from resulting in undesired noise (popping) on the loudspeakers. For so doing, the circuit provides for generating a controlled positive potential at the negative input in relation to the positive input of the amplifier when this is switched on or off. More specifically, when switching on, the potential difference is maintained pending switching of all the sources on the amplifier, after which, it is gradually eliminated for enabling the output to reach the steady-state value slowly and in controlled manner; whereas, when switching off, the potential difference is generated gradually for enabling the output of the amplifier to be grounded slowly prior to turning off the amplifier itself.

16 Claims, 3 Drawing Sheets

AUDIO AMPLIFIER ON-OFF CONTROL CIRCUIT

TECHNICAL FIELD

The present invention relates to an on-off control circuit for audio amplifiers, in particular, single-ended, single-feed types.

BACKGROUND OF THE INVENTION

Audio amplifiers at present are normally provided with a partial turn-off (or standby) function controlled by a pin on the amplifier integrating device as shown by way of example in FIG. 1, which shows a standard audio amplifier 1 having a positive input connected via capacitor 2 to the IN signal pin; an inverting input connected to the amplifier output via capacitor 9 and feedback resistor 3, and grounded via resistor 4; and a supply pin connected to the $V_{CC}$ voltage supply line. A capacitor 14 is provided between the supply line and ground, and the amplifier output supplies a loudspeaker 5 d.c.-decoupled by capacitor 13. Amplifier 1 also presents a standby input connected to a parallel RC network including a capacitor 6 and a resistor 7 (normally external) connected between the standby input and ground. A switch 8 is series connected to resistor 7 and opened and closed externally for charging capacitor 6 to a value corresponding to normal operation of the amplifier, or discharging it via resistor 7 for activating the standby function.

The standby function, which may be user controlled or activated automatically in the event of a change in the signal source for eliminating undesired signals in the loudspeakers, consists in turning off practically the whole of the audio amplifier circuit, in particular the portion strictly relating to the output, so that the signal at the IN input is not transferred to the loudspeakers, and the amplifier (and on-off circuit) absorbs a very low current.

When switching from standby to on or off or vice versa, or from off to normal operation or vice versa, i.e., when the single-feed amplifier is turned on or off, the amplifier output undergoes considerable excursions (typically between 0 and 15 V in the case of a 30 V supply voltage) which are poorly controlled and comprise peaks in response to rapid transient states of the supply voltage or standby pin, which peaks are reproduced in the loudspeaker in the form of undesired noise (known in slang as "popping").

One attempt to eliminate the above noise has been to employ high-value capacitors for slowing down variations in the supply and standby voltages at the turn-on phase. Though valid, providing the charge time constant of the capacitors is low enough (slow charge), such a solution fails to provide for rapid operation of the audio system as a whole, as required for obvious reasons by the user. Moreover, as regards transient supply voltage, only charging of the capacitor is controllable, discharging being invariably rapid by virtue of the capacitor discharging into the low-value equivalent resistor of the overall circuit. As for the standby function, discharge is invariably rapid for the reasons explained below with reference to FIG. 2, which shows a simplified diagram of the turn-on circuit comprising capacitor 6, resistor 7 (having a low resistance $R_1$) and switch 8, and in which the amplifier is represented solely by two resistors 10, 11 having the same resistance R, series connected between the supply and ground, and the midpoint of which presents standby voltage $V_{ST}$.

When switch 8 in the FIG. 2 circuit is closed, capacitor 6 discharges into the total resistance of equivalent resistance R/2 parallel to resistance $R_1$, i.e., into a resistance roughly equal to $R_1$, thus setting the device to standby mode, whereas, when switch 8 is opened, capacitor 6 charges to the steady-state standby voltage via resistance $R_2$ which is considerably greater than $R_1$.

Consequently, whereas the capacitor may charge slowly, it discharges at a faster rate which cannot be slowed down on account of resistance $R_1$, which must necessarily be low to ensure that, in standby mode, voltage $V_{ST}$ is low enough to keep the amplifier practically off. On the other hand, any increase in the capacitance of the capacitor would result in the amplifier being turned on again too slowly.

SUMMARY OF THE INVENTION

It is an object of the present invention to provide a circuit designed to overcome the above problem by ensuring controlled transient output voltage of the operational amplifier during switching, and more specifically, when switching on from full turn-off or standby mode, and similarly when switching from normal operation to standby mode.

According to the present invention, there is provided an audio amplifier on-off control circuit as claimed in claim 1.

In other words, according to the present invention, when the operating mode of the audio amplifier is so switched as to result in an uncontrolled variation of the output, a controlled positive potential difference is generated between the negative and positive inputs of the amplifier so that the output remains grounded. When the amplifier is turned on, said potential difference is maintained pending switching of all the sources on the amplifier, after which it is eliminated gradually to allow the output to reach the steady-state value slowly and in controlled manner. Conversely, when the amplifier is turned off, the potential difference is applied gradually to allow the output to be grounded slowly before the amplifier is turned off.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 3:
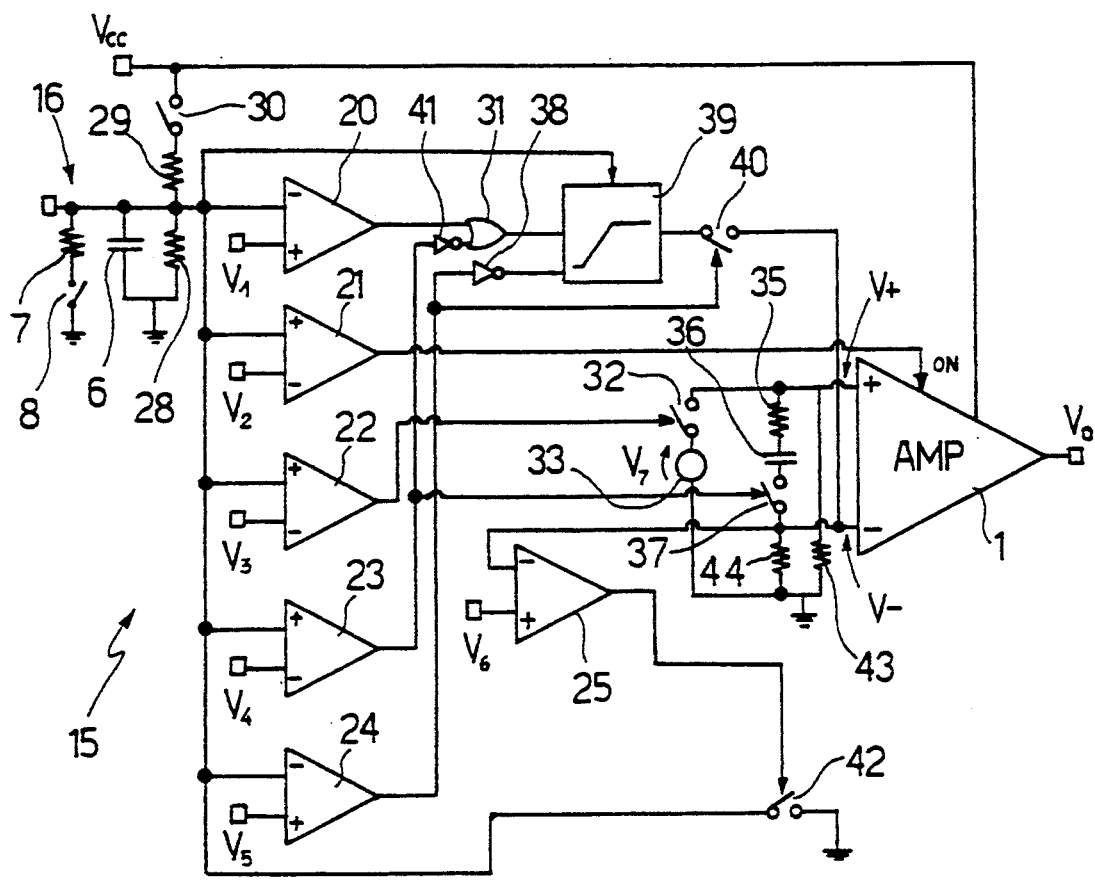
FIG. 3 shows a logic block diagram of the circuit according to the present invention.
Figure 2:
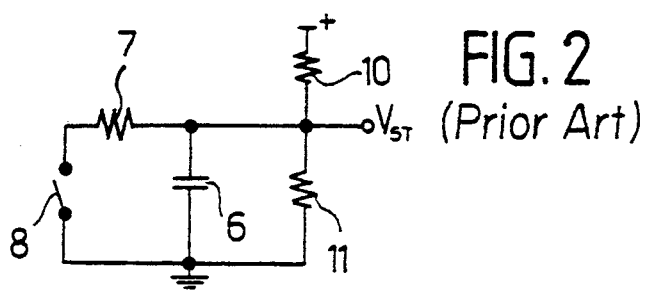
FIG. 2 shows an equivalent circuit diagram of the FIG. 1 circuit.

FIG. 3 shows an audio amplifier 1, and an on-off control circuit 15 comprising capacitor 6, resistor 7, and switch 8, and in which node 16 common to both capacitor 6 and resistor 7 presents standby voltage $V_{ST}$ supplied to the input of audio amplifier 1 over a line not shown. Circuit 15 also comprises six comparators 20–25. The negative inputs of comparators 20 and 24 and the positive inputs of comparators 21–23 are connected to node 16; the positive inputs of comparators 20 and 24 and the negative inputs of comparators 21–23 are connected to respective reference voltages $V_1$, $V_5$, $V_2$, $V_3$, $V_4$; and the negative and positive inputs of comparator 25 are connected respectively to the negative input of amplifier 1 and to reference voltage $V_6$. Voltages $V_1$–$V_5$ are so selected that $V_1 < V_2 < V_3 < V_4 < V_5$, whereas voltage $V_6$ is generated separately and independently of the others, and is lower than the steady-state value of voltage $V+$ at the positive input of amplifier 1.

Node 16 is also grounded via resistor 28, and connected to the supply via series connected resistor 29 and switch 30.

The output of comparator 20 is connected to a first input of an OR circuit 31, the second input of which is connected to the output of comparator 23 via inverter 41; the output of comparator 21 is connected to the ON input of amplifier 1; the output of comparator 22 is connected to the control terminal of a switch 32 series connected to a voltage source 33 supplying voltage $V_7$, and located between the positive input of amplifier 1 and ground; in addition to inverter 41, the output of comparator 23 is also connected to the control terminal of a switch 37 series connected to a resistor 35 and capacitor 36 between the positive and negative inputs of amplifier 1; the output of comparator 24 is connected, via inverter 38, to the reset input of a ramp generator 39, and directly to the control terminal of a switch 40 between the output of ramp generator 39 and the negative input of amplifier 1; and the output of comparator 25 is connected to the control terminal of a switch 42 between node 16 and ground.

The output of OR circuit 31 is connected to the start input of ramp generator 39, which is also connected to node 16. When the start input is enabled, ramp generator 39 provides for generating an output voltage increasing from a minimum $V_{MIN}$, equal to the instantaneous value of voltage $V-$ at the negative input of amplifier 1, to a maximum $V_{MAX}$, equal to $V_{ST} + 3\,V_{be}$ (where $V_{be}$ is the typical base-emitter voltage drop of a normal transistor when on). Resistors 43 and 44 are provided between the positive and negative inputs respectively of amplifier 1 and ground.

Figure 4:
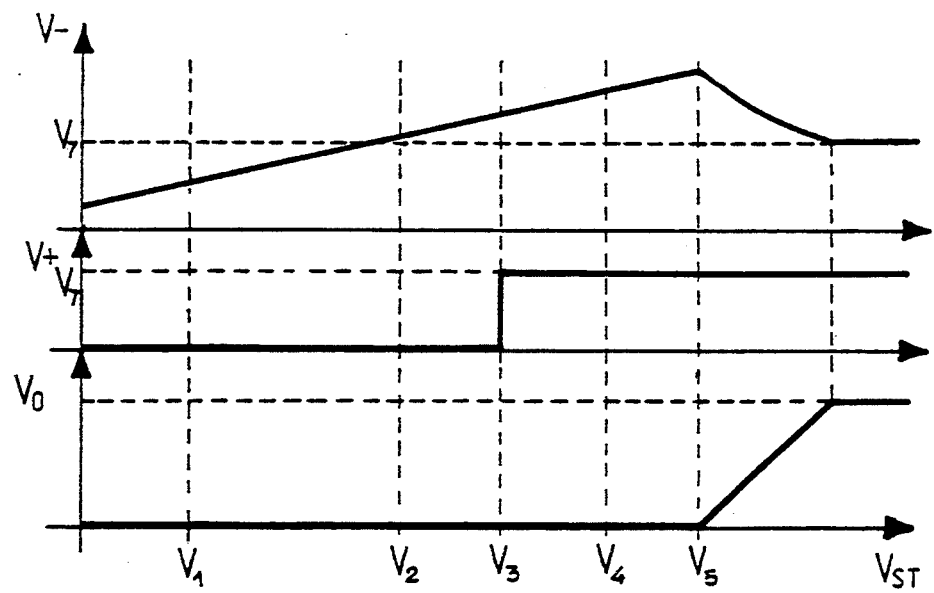
FIGS. 4 and 5 show graphs of a number of electric quantities (not to scale) in the FIG. 3 diagram as a function of standby voltage.
Figure 5:
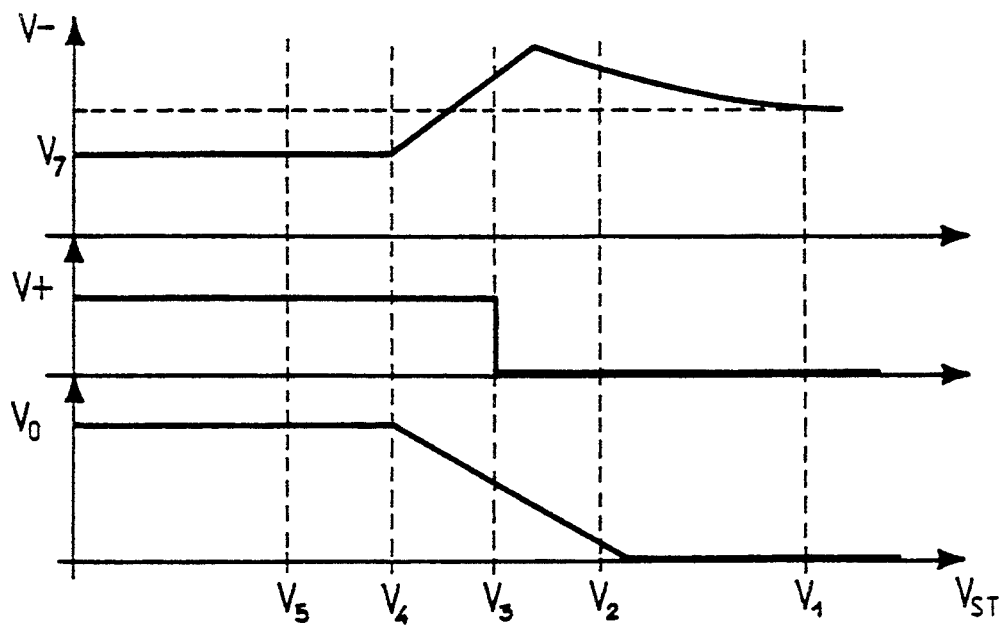

With reference also to FIG. 4, off-on operation of circuit 15 will now be described commencing from the full off condition wherein all the electric quantities are zeroed and supply voltage $V_{CC}$ is applied.

$$V_{ST} < V_1 \text{ and } V- < V_6 \tag{1}$$

In this phase, the outputs of comparators 20 and 24 are high, so that comparator 20 supplies a start pulse to ramp generator 39, comparator 24 closes switch 40, and the voltage generated by ramp generator 39 and increasing linearly from 0 V is applied to the negative input of amplifier 1, thus increasing voltage $V-$. As long as $V-$ remains lower than $V_6$, however, the output of comparator 25 remains high, so that switch 42 remains closed and node 16 grounded.

$$V_{ST} < V_1 \text{ and } V- > V_6 \tag{2}$$

When $V-$, increased by the ramp voltage, exceeds $V_6$, the output of comparator 25 switches to low, thus opening switch 42 and enabling an increase in $V_{ST}$.

$$V_{ST} > V_1 \tag{3}$$

The output of comparator 20 simply switches to low.

$$V_{ST} > V_2 \tag{4}$$

The output of comparator 21 switches to high, thus turning on amplifier 1, the output of which, however, remains low by virtue of the higher potential at the negative as compared with the positive input.

$$V_{ST} > V_3 \tag{5}$$

Comparator 22 switches, thus closing switch 32 and connecting voltage source 33 to the positive input of amplifier 1, which thus presents voltage $V_7$. As $V_7$, however, is lower than the voltage at the negative input (now equal to $V_{MAX}$), the output of amplifier 1 grounded.

$$V_{ST} > V_4 \tag{6}$$

The output of comparator 23 switches to high, so that switch 37 closes and capacitor 36 begins charging. Due to the positive voltage remaining between the negative and positive inputs of amplifier 1, however, the output of the amplifier remains low.

$$V_{ST} > V_5 \tag{7}$$

Comparator 24 switches so as to reset ramp generator 39 and open switch 40; the negative input of amplifier 1, no longer forced to potential $V_{MAX}$, tends towards potential $V_7$ at the positive input; capacitor 36 discharges the voltage at its terminals via resistors 35 and 44; and the amplifier output gradually switches to the steady-state potential. Even so, however, voltage $V-$ still remains higher than $V_6$, so that switch 42 is kept open by comparator 25, thus enabling the standby voltage to reach the steady-state value, and normal operation of amplifier 1.

Operation as described above also applies when switching on from standby mode, by virtue of switch 8, in standby mode, being closed and so maintaining a very low $V_{ST}$ value of less than $V_1$. The only difference in this case is that, as opposed to zero, voltage $V-$ at the negative input of amplifier 1 presents a predetermined positive value, e.g., $3\,V_{be}$, so that, when switch 8 is opened, $V- > V_6$. Phase (1) is therefore skipped and operation commenced directly from phase (2).

Operation of the circuit will now be described relative to switching from normal operation to standby mode, for which purpose, switch 8, which is normally open, is closed, and capacitor 6 begins discharging so as to gradually reduce voltage $V_{ST}$.

$$V_{ST} > V_5 \tag{1}$$

In this phase, the outputs of comparators 21–23 are high, the outputs of comparators 20, 24 and 25 are low, so that switches 32 and 37 are closed and switches 40 and 42 open, and ramp generator 39 is reset; $V- = V+ = V_7$ and the output of amplifier 1 operates normally.

$$V_{ST} < V_5 \tag{2}$$

Comparator 24 switches, thus closing switch 40 and canceling the reset signal to ramp generator 39, which, in the absence of the start signal, however, remains idle.

$$V_{ST} < V_4 \tag{3}$$

Comparator 23 switches, thus opening switch 37 and supplying the start signal to ramp generator 39, which supplies an output voltage increasing gradually from $V_{MIN}$ (equal to $V_7$) to the negative input of amplifier 1, so that V− becomes greater than V+, and $V_o$ begins to fall.

$$V_{ST} < V_3 \tag{4}$$

Comparator 22 switches, thus opening switch 32, and the positive input of amplifier 1 is grounded, thus confirming V−>V+.

$$V_{ST} < V_2 \tag{5}$$

Comparator 21 switches, so as to turn off the internal sources of amplifier 1 and consequently also the amplifier itself, the zero output of which, however, results in no undesired noise.

$$V_{ST} < V_1 \tag{6}$$

Comparator 20 switches, thus generating a start pulse for ramp generator 39, which, in the absence of the reset signal, nevertheless remains idle.

The circuit therefore switches to standby mode wherein voltage $V_{ST}$ presents a very low value, V+ =0 V, and V− =$V_{MAX}$=3 $V_{be}$.

For achieving the above timing, the FIG. 3 voltages are preferably selected so that $V_1 < 1$ V; $V_2 > 1.4$ V; $V_3 > 2.1$ V; $V_4 > 2.8$ V; $V_5 > 3.5$ V; $V_6 = 1$ V; and $V_7 = 1.4$ V.

The rise and fall time constant of the output is determined by the discharge and charge time constant of capacitor 6.

Figure 1:
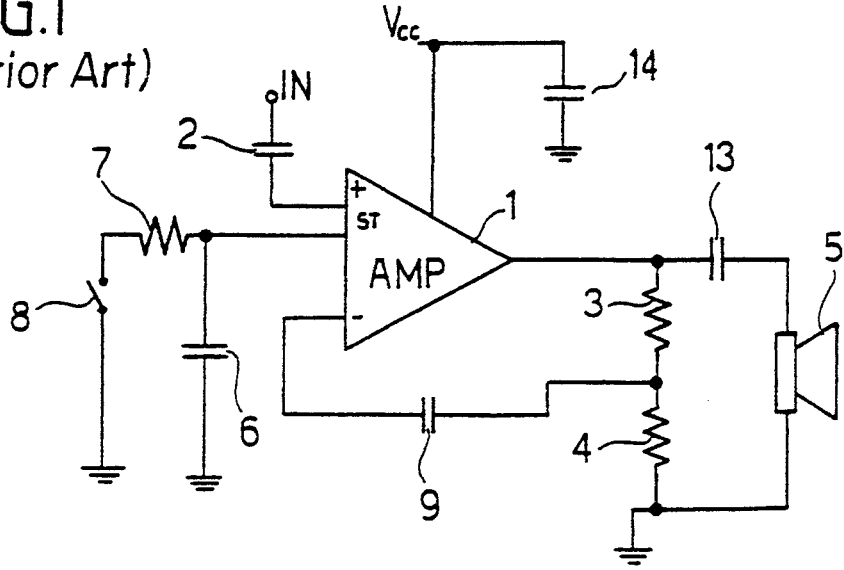
FIG. 1 shows a simplified electric diagram of a known audio amplifier on-off control circuit.
Figure 6:
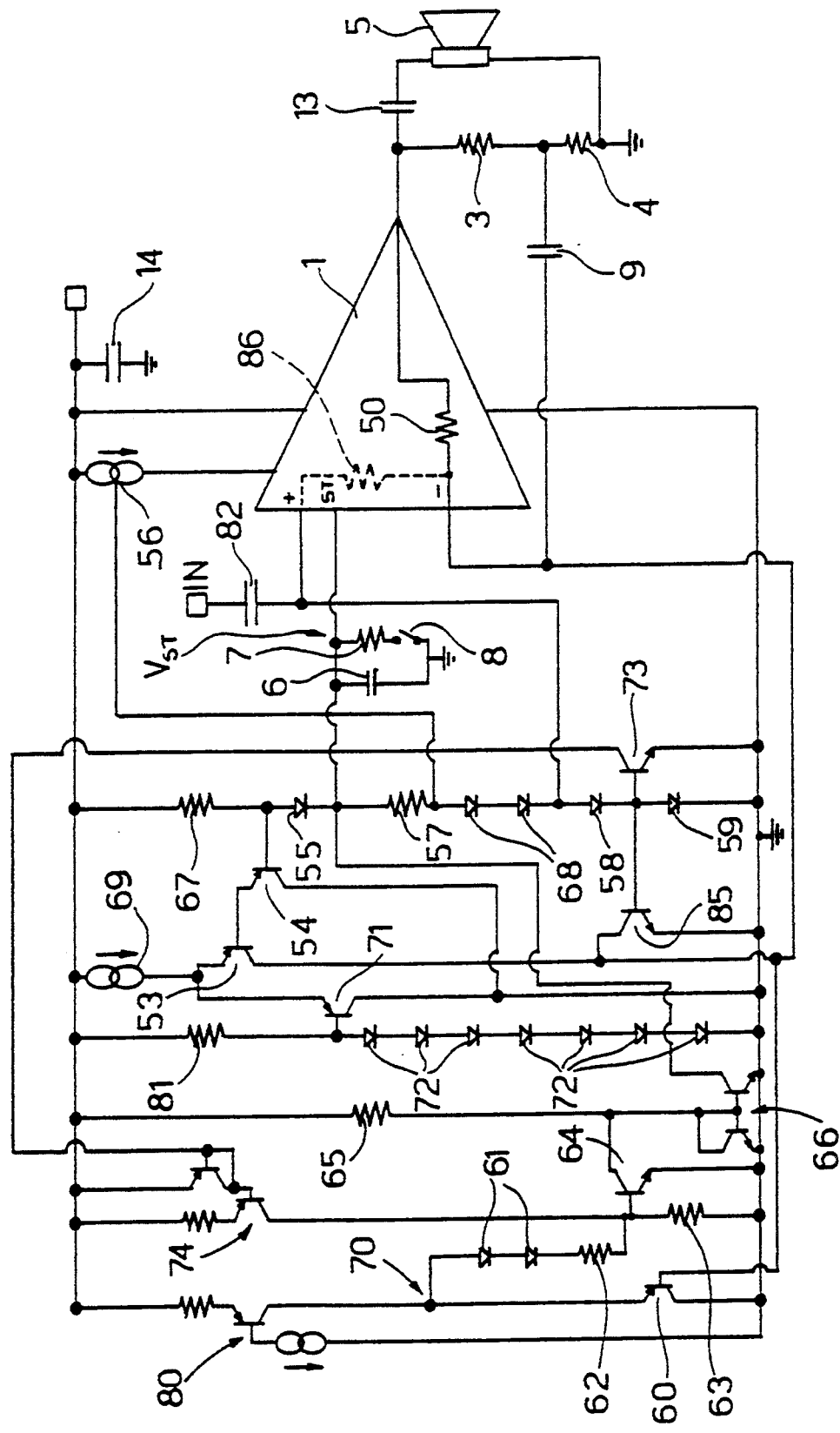
FIG. 6 shows a circuit diagram of the circuit according to the present invention.

FIG. 6 shows one possible application of the FIG. 3 configuration to a single-feed monophonic audio amplifier connected to a loudspeaker as shown in FIG. 1. More specifically, FIG. 6 shows audio amplifier 1 with equivalent internal resistance 50 between the output and negative input, and equivalent resistance 86 between the positive and negative inputs; components 6–8; feedback network 3, 4, 9; and loudspeaker 5.

The FIG. 6 circuit comprises a bias network 80 connected between the supply and a node 70 defined by the emitter of a PNP transistor 60 having its base connected to the negative input of amplifier 1, and its collector grounded. Node 70 is connected to one terminal of a chain of two diodes 61 and two resistors 62, 63, the other terminal of which is grounded. The node between resistors 62 and 63 is connected to a controlled current source 74 and to the base of an NPN transistor 64, the emitter of which is grounded, and the collector of which is connected to a node between a resistor 65 (also connected to the supply) and a current mirror circuit 66 also connected to the standby input. A current source 69 drives a differential stage comprising two PNP transistors 53 and 71. The base of transistor 71 is connected to a node between a resistor 81 (also connected to the supply) and a series of seven diodes 72 (also grounded). The collector of transistor 71 is grounded, and that of transistor 53 connected to the negative input of amplifier 1. The base of transistor 53 is connected to the emitter of a PNP transistor 54, the collector of which is grounded, and the base of which is connected to a node between a resistor 67 (also connected to the supply) and the cathode of a diode 55, the anode of which is connected to the standby input and to a grounded chain comprising, in succession, a resistor 57 and a series of four diodes 68, 58 and 59. The node between diodes 58 and 59 is connected to the base of an NPN transistor 73, the emitter of which is grounded, and the collector of which controls the current source 74. The same node is also connected to the base of an NPN transistor 85 (forming a current mirror with diode 59 and transistor 73), the emitter of which is grounded, and the collector of which is connected to the negative input of amplifier 1. The node between resistor 57 and diodes 68 is connected to the control terminal of a current source 56 driving the internal sources of amplifier 1. The positive input of amplifier 1 is connected to the signal input terminal via capacitor 82.

In the FIG. 6 circuit, comparator 20 is formed by components 53–55, 9, and 4; comparator 21 by components 56–59, 68; comparator 22, voltage source 33 and switch 32 by diodes 58, 59; comparator 23 by components 59, 60, 85; comparator 24 by transistor 60; comparator 25 by components 60–66; divider 29, 28 by components 67, 55, 57, and 68, 58, 59; ramp generator 39 by components 53–55, 9, and 4; and switch 42 by mirror circuit 66. Resistors 35, 43 and 44 are represented by internal resistance 86.

In the FIG. 6 circuit, the steady-state direct current offset of output voltage $V_o$ equals roughly half supply voltage $V_{CC}$. In fact, diode 59 is supplied with a predetermined current as a function of supply voltage, according to the equation:

$$I = (V_{CC} - 5V_{be})/2R$$

where $V_{be}$ is the voltage drop of diodes 55, 68, 58, 59; and R the resistance of resistors 67, 57.

Transistor 85, forming a 1:1 mirror with diode 59, conducts and supplies current I to resistor 50 also of value R. As the input stage of amplifier 1 is formed by a differential amplifier and, for reasons of dynamics, the positive input is set to potential 2 $V_{be}$ via diodes 58, 59, the negative input also presents 2 $V_{be}$, so that:

$$V_o = 2V_{be} + RI,$$

that is $$V_o = V_{CC}/2 - V_{be} \approx V_{CC}/2$$

The steady-state standby potential equals $$V_{ST} = 4V_{be} + RI = V_{CC}/2 + 3V_{be}/2$$

at which the current sources of amplifier 1 are on; the amplifier is operative; and the audio signal at the IN input is transferred to the loudspeaker with a gain determined by feedback network 3, 4, 9.

When the circuit shown is switched from normal operation to standby mode, therefore, the output switches from $V_{CC}/2$ to ground, and vice versa when the circuit is turned on, with a transient state controlled, according to the present invention, by applying a positive potential to the negative input in relation to the positive input, as described below.

More specifically, when switched on from standby mode, the FIG. 6 circuit operates as follows.

In standby mode, switch 8 is grounded by very low resistor 7, so that the current sources of the amplifier are off; the current in the branch formed by components 57, 68, 58, 59 is zero, so that the voltage at the positive input, as at the output, is zero; and the negative input is forced to a potential of 3 $V_{be}$ for the following reason: as $V_{ST}=0$ V, transistors 53, 54 and diode 55 are on; and as the current in source 69 is high enough for the collector load of transistor 53, this is saturated so that the collector connected to the negative input presents a potential of roughly 3 $V_{be}$.

To turn on the circuit, switch 8 is opened, so as to charge capacitor 6 slowly via fairly high resistor 67. In this phase, transistor 60 is off, by virtue of its base presenting a potential of 3 $V_{be}$ (potential V−) and its emitter the 3.5 $V_{be}$ potential (of node 70) determined by the chain formed by diodes 61, transistor 64 (on in this phase) and resistor 62, the terminals of which present a voltage of 0.5 $V_{be}$ as divided between resistors 62 and 63. As transistor 64 is on, current mirror 66 is off, thus enabling charging of the standby voltage via capacitor 6 and resistor 67.

As $V_{ST}$ increases, the current sources of the amplifier are the first to be turned on (via resistor 57 and current source 56); and upon $V_{ST}$ reaching 2 $V_{be}$, diodes 68 are turned on and the positive input begins to rise.

Upon $V_{ST}$ reaching 4 $V_{be}$, diodes 58 and 59 are turned on; transistor 85 is turned on, thus absorbing the collector current of transistor 53 and the current from capacitor 9; and capacitor 9 begins discharging from the former 3 $V_{be}+V_{ST}$ value. When $V_{ST}$ reaches 5 $V_{be}$ and the emitters of transistors 53 and 71 present a voltage of 8 $V_{be}$ transistor 71 is turned on; differential stage 53, 71 is balanced; the current from source 69 is also supplied to transistor 71; and the current in transistor 53 falls, thus causing a further reduction in potential V− at the negative input. When $V_{ST}>5$ $V_{be}$, transistor 53 is turned off, and the current from source 69 is supplied solely to transistor 71. In this phase, transistor 73, forming a current mirror with diode 59, turns on circuit 74, which in turn keeps transistor 64 on, so that current mirror circuit 66 remains definitely off, regardless of the potential at the base of transistor 60.

The circuit is thus brought slowly up to the steady-state condition, but as long as V−>V+, output $V_o$ of the amplifier remains grounded, despite the amplifier being turned on. Subsequently, as both the inputs of amplifier 1 reach the same potential, thus balancing the amplifier, the output follows the standby voltage so as to switch to the steady-state value.

Operation of the circuit for switching from off to on is the same as described above, except that, in this case, voltage V− at the negative input of amplifier 1 is initially zero, and is increased gradually by the charging of capacitor 9 by transistor 53. In this phase, the potential at the base of transistor 60 is low, so that transistor 60 is turned on, thus lowering the voltage at node 70; and diodes 61 and transistor 64 are off, so that current mirror 66 is on, thus maintaining a low potential at the standby input. This phase continues until V− exceeds 2.8 $V_{be}$, at which point, transistor 60 is turned off, and component chain 61, 62, 64 turned on, thus turning off mirror 66 and so enabling an increase in voltage $V_{ST}$ as described above.

Operation of the circuit will now be described relative to switching from normal operation to standby mode. When switch 8 is closed, capacitor 6, charged to steady-state voltage $V_{ST}(V_{CC}/2+3 V_{be}/2)$, begins discharging at a faster rate than that at which it is charged, by virtue of the low resistance of resistor 7.

As long as $V_{ST}>5$ $V_{be}$, transistor 53 is off, and the current from source 69 is supplied entirely to transistor 71. Subsequently, transistor 53 starts conducting to supply transistor 85 and capacitor 9. In this phase, the negative input does not increase immediately, but in controlled manner, by virtue of transistor 85; while the output falls by following the potential at the standby input, to which it is related as a function of the (in this case, falling) collector current of transistor 85. When transistor 85 is turned off, diode 59 is turned off due to the reduction in $V_{ST}$, so that the negative input increases more rapidly, while the potential at the positive input is zeroed, and the output of amplifier 1 switches to 0 V due to unbalancing of the inputs. As the negative input increases further to 3 $V_{be}$, the amplifier sources, and consequently also the amplifier itself, remain on. When the sources are turned off ($V_{ST}\cong 0$ V), the amplifier is in standby mode.

It will be noted that the above sequences occur in the presence of supply voltage $V_{CC}$, that is, in the presence of fixed references with the control circuits on.

The advantages of the circuit according to the present invention will be clear from the foregoing description. In particular, it provides for controlled on or off switching at all times of the output, thus preventing transients resulting in undesired noise (popping).

The function described may be employed when the user equipment is set to standby mode, for reducing line absorption, when turning off the volume or switching the signal source.

The same circuit may also be employed for a single-ended two-channel audio amplifier operating in the same manner, by simply duplicating a number of structures, i.e., via the addition of a small number of components.

The same pin on the audio amplifier integrating device may be employed for supply voltage rejection (SVR) or standby, i.e., for performing two functions; and a single capacitor (component 6) is capable of performing both the SVR function as well as determining the time constant of the on and off phases.

The circuit also provides for an excellent compromise in terms of transition time and the noise produced in the loudspeakers.

Finally, the circuit according to the present invention provides for a high degree of reliability, as well as trouble-free manufacture and integration using current manufacturing techniques.

To those skilled in the art it will be clear that changes may be made to the circuit as described and illustrated herein without, however, departing from the scope of the present invention.

We claim:

1. A control circuit for controlling the turn on and turn off characteristics of an amplifier, the amplifier having positive and negative input terminals, and a standby input terminal to selectively enable and disable the amplifier, the amplifier generating an output signal when the standby input terminal is selectively enabled, the circuit comprising:

a voltage source connectable to the negative input terminal and generating an increasing voltage signal;

first comparing means for generating a first control signal, said first comparing means having a negative input and a positive input and a comparator output, said first negative input coupled to the amplifier standby input terminal, said first positive input receiving a first threshold voltage, said first comparator output activating said increasing voltage source when the amplifier is selectively enabled and the voltage on the standby input terminal is less than said first threshold voltage;

second comparing means for generating a second control signal, said second comparing means having a negative input and a positive input and a comparator output, said second negative input coupled to the standby input terminal, said second positive input receiving a second threshold voltage greater than said first threshold voltage, said second comparator output resetting said increasing voltage source when the amplifier is selectively enabled and the voltage on the standby input terminal exceeds said second threshold voltage;

third comparing means for generating a third control signal, said third comparing means having a negative input and a positive input and a comparator output, said third positive input coupled to the standby input terminal, said third negative input receiving a third threshold voltage greater than said first threshold voltage and less than said second threshold voltage, said third comparator output coupling a control voltage to the positive input terminal when the amplifier is selectively enabled and the voltage on the standby input terminal exceeds said third threshold voltage;

fourth comparing means for generating a fourth control signal, said fourth comparing means having a negative input and a positive input and a comparator output, said fourth positive input coupled to the standby input terminal, said fourth negative input receiving a fourth threshold voltage greater than said third threshold voltage and less than said second threshold voltage, said fourth comparator output activating said increasing voltage source when the amplifier is selectively disabled to permit the signal at the negative input terminal to increase in amplitude relative to the positive input terminal and causing the output from the amplifier to decrease in amplitude; and fifth comparing means for generating a fifth control signal, said fifth comparing means having a negative input and a positive input and a comparator output, said fifth negative input coupled to the negative input terminal, said fifth positive input receiving a fifth threshold voltage less than the voltage at the positive input terminal, said fifth comparator output coupling the standby input terminal to a circuit ground when the voltage at the negative input terminal is less than said fifth threshold voltage, whereby the output of the amplifier is controlled by the circuit such that the output does not have undesired transients.

2. The circuit of claim 1, further including switch means controlled by said second comparator output for coupling said increasing voltage signal to the positive input terminal, said increasing voltage signal being coupled to the positive input terminal until said increasing voltage source is reset.

3. The circuit of claim 1, further including switch means controlled by said fourth comparator output for coupling a resistor and a capacitor between the positive negative input terminals when the voltage at the standby input terminal is greater than said fourth threshold voltage, said capacitor being charged by said control voltage when coupled between the positive and negative input terminals.

4. The circuit of claim 1, further including sixth comparing means for generating a sixth control signal, said sixth comparing means having a negative input and a positive input and a comparator output, said sixth positive input coupled to the standby input terminal, said sixth positive input receiving a sixth threshold voltage greater than said first threshold voltage and less than said third threshold voltage, said sixth comparator output enabling a current source supplied to the amplifier when the voltage on the standby input terminal exceeds said sixth threshold voltage.

5. The circuit of claim 1 wherein said first, second, third, and fourth comparing means are voltage comparators.

6. A circuit for on-off control of an audio amplifier having a positive and negative input, and including current sources; characterized by the fact that it comprises:

a first increasing voltage source connectable to said inputs of said amplifier;

first activating means for generating a signal for turning on said current sources;

first deactivating means for deactivating said first voltage source;

second activating means activated during the switch-on phase, for activating, in sequence, said first voltage source, said first activating means and said first deactivating means;

a second increasing voltage source connectable to said inputs of said amplifier;

second deactivating means for deactivating said current sources; and third activating means activated during the switch-off phase, for activating, in sequence, said second voltage source and said second deactivating means.

7. A circuit as claimed in claim 6, characterized by the fact that it also comprises a third voltage source connectable to the positive input of said amplifier; and control means activated by said second activating means subsequent to said first activating means, deactivated by said third activating means prior to said second deactivating means, and designed to activate said third voltage source.

8. A circuit as claimed in claim 7, characterized by the fact that said first, second and third activating means, said first and second deactivating means, and said control means consist of comparators.

9. A circuit as claimed in claim 6, characterized by the fact that said first and second increasing voltage sources comprise a ramp generator.

10. A circuit as claimed in claim 6 for an amplifier having a standby input; characterized by the fact that it comprises a first, second, third, fourth, fifth, and sixth comparator; said first and fifth comparators having a negative input connectable to said standby input, and said second, third, and fourth comparators having a positive input connectable to said standby input; said first, second, third, fourth, and fifth comparators having a second input connected to a respective gradually increasing reference voltage; said sixth comparator having a negative input connectable to the negative input of said amplifier, and a positive input connected to a reference voltage; the output of said first comparator driving a ramp generator having its output connected to said negative input of said amplifier; the output of said second comparator being connectable to a terminal enabling said current sources; the output of said third comparator driving a first switch between said positive input of said amplifier and a voltage source; the output of said fourth comparator driving said ramp generator and a second switch on a line connecting said positive input to said negative input of said amplifier and including resistive means and capacitive means; said fifth comparator having its output connected to the reset input of said ramp generator and to a third switch between said output of said ramp generator and said negative input of said amplifier; and said sixth comparator having its output connected to a fourth switch between said standby input and a reference potential line.

11. An on-off method for an audio amplifier having a positive input, a negative input, an output, and current sources; characterized by the fact that it comprises a turn-on phase and a turn-off phase; said turn-on phase comprising steps wherein a positive potential difference is generated between said negative input and said positive input of said amplifier, for maintaining said output at a reference potential; said current sources are turned on, with said output at said reference potential; and said potential difference is reduced gradually for enabling said output to reach a steady-state value differing from said reference potential; said turn-off phase comprising steps wherein a positive potential difference is generated gradually between said negative input and said positive input of said amplifier, so as to bring said output gradually from said steady-state value to said reference potential, with said current sources on, and turn off said current sources with said output at said reference potential.

12. A control circuit for controlling the turn on and turn off characteristics of an amplifier, the circuit comprising:

positive and a negative input terminals on the amplifier;

an output terminal at the amplifier providing an output signal;

a standby input terminal on the amplifier to permit the selective enabling and disabling of the amplifier;

an increasing voltage source generating an increasing voltage signal coupled to said input terminals;

a first control circuit portion coupled to said increasing voltage source, which is activated when the amplifier is selectively enabled to cause said increasing voltage source to generate said increasing voltage signal;

a reset signal circuit portion coupled to the standby input terminal and to said increasing voltage source, which deactivates said increasing voltage source when the voltage on the standby input terminal exceeds a first predetermined threshold; and a second control circuit portion coupled to the standby input terminal and said increasing voltage source, which is activated when the amplifier is selectively disabled to cause the sequential activation of said increasing voltage source that is coupled to the negative input terminal.

13. The circuit of claim 12, further including a second voltage source connectable to said positive input and controlled by a third control circuit portion, said third control circuit portion activated by said first control circuit portion and deactivated by said reset and second control circuit portions, said second voltage source being applied to said positive input terminal when activated.

14. The circuit of claim 12, further including a fourth control circuit portion coupled to the standby input terminal and to the amplifier and activated when the voltage on the standby input terminal exceeds a second predetermined threshold to control a current source supplied to the amplifier.

15. The circuit of claim 12 wherein said first, second and reset control circuit portions are voltage comparators.

16. The circuit of claim 12 wherein said increasing voltage source is a ramp generator.

* * * * *